May 19, 1959 P. EISLER 2,886,880

METHOD OF PRODUCING ELECTRIC CIRCUIT COMPONENTS

Original Filed Feb. 27, 1948 8 Sheets-Sheet 1

Inventor
PAUL EISLER
By [signature]
Attorney

METHOD OF PRODUCING ELECTRIC CIRCUIT COMPONENTS

Original Filed Feb. 27, 1948 8 Sheets-Sheet 2

Inventor
PAUL EISLER
By [signature]
Attorney

May 19, 1959 P. EISLER 2,886,880

METHOD OF PRODUCING ELECTRIC CIRCUIT COMPONENTS

Original Filed Feb. 27, 1948 8 Sheets-Sheet 3

Inventor
PAUL EISLER
By [signature]
Attorney

Inventor
PAUL EISLER
By [signature]
Attorney

METHOD OF PRODUCING ELECTRIC CIRCUIT COMPONENTS

Original Filed Feb. 27, 1948 8 Sheets-Sheet 5

Inventor
PAUL EISLER
By [signature]
Attorney

May 19, 1959 P. EISLER 2,886,880

METHOD OF PRODUCING ELECTRIC CIRCUIT COMPONENTS

Original Filed Feb. 27, 1948 8 Sheets-Sheet 6

Inventor
PAUL EISLER
By [signature]
Attorney

Inventor
PAUL EISLER
By [signature]
Attorney

METHOD OF PRODUCING ELECTRIC CIRCUIT COMPONENTS

Original Filed Feb. 27, 1948 8 Sheets-Sheet 8

Inventor
PAUL EISLER
By [signature]
Attorney

United States Patent Office 2,886,880

Patented May 19, 1959

2,886,880

METHOD OF PRODUCING ELECTRIC CIRCUIT COMPONENTS

Paul Eisler, London, England, assignor to Hermoplast Limited, London, England, a corporation of Great Britain Application February 27, 1948, Serial No. 11,796, which is a division of application Serial No. 520,991, February 3, 1944, now Patent No. 2,441,960, dated May 25, 1948. Divided and this application May 26, 1952, Serial No. 290,106

1 Claim. (Cl. 29—155.5)

This invention relates to the manufacture of electrical apparatus, and particularly to the production of electric and magnetic circuits and parts thereof, and to the article so provided.

A principal purpose of the invention is to facilitate and cheapen quantity production of electric circuit components, such as the resistances, inductances, transformers, tubes and interconnecting networks or circuit connections of radio apparatus, the cores and windings of iron-cored transformers and dynamo electric machines, the connecting networks of switchboards, the conductors of heating appliances, and generally of any electrical circuit component which it may be convenient to manufacture by the methods herein disclosed.

A further purpose of the invention is to facilitate the production of electrical circuit components, even though they be not needed in great quantities, in which a high degree of precision is required in the dimensioning or relative location of conductors such as cannot readily be obtained by known means.

Yet another object of the invention is the production of surface heating elements in which the conductor also constitutes or carries an ornamentation.

Other objects of the invention will appear from the description following.

Most electrical circuit components essentially comprise metal parts, conducting electric current or magnetic flux, supported upon an insulating base, or with interposed insulation upon a metal base.

The invention consists in the production of the metal electric and magnetic conductors in position upon their insulating support by a process based on the printing of a representation of the conductive metal, and of the article resulting therefrom.

The common way of building up an electrical circuit or circuit element is first to draw metal into wire, that is to say, make a linear conductor, and afterwards to shape this conductor into coils and networks. By the application of the methods of the printing art the invention brings the metal conductor of the circuit component into existence in its final form, or in a development of that form upon a plane or cylindrical surface.

A typical instance of the invention comprises the steps of preparing by any of the well-known methods of the printing art, a printing plate for printing a representation of the metal electric or magnetic conductors of the circuit component or a part of them; making an imprint by the aid of the printing plate upon a surface thereby differentiating on that surface the areas which are required to be conductive from the areas which are required to be non-conductive; and from that imprint producing the conductor by subjecting the printed surface to treatment which operates differently on the areas of the surface differentiated by the printing, thereby changing the differentiation into a differentiation of conductive and non-conductive areas.

The development of the conductor from the imprint is in most cases effected by methods adapted from the printing art or analogous to the methods of the printing art, such as etching, bronzing, electro-deposition and the like.

Where on account of the process of development adopted, or on account of the nature of the fabric which is to form the permanent base of the conductor, it is inconvenient to make imprint on the permanent base, it may be made on a temporary base, which must be removable, and the development process be followed by a transfer process akin to those known in the printing art.

The invention is explained hereinafter by a description of the production of various circuit components by its aid. This description refers to the accompanying drawings in which—

The diagram of connections or hook-up shown in Figure 1 forms no part of the invention, is substantially known, and therefore will not be described further than is necessary to assist the understanding of the later figures. It is seen to consist of valves V1, V2 etc., resistances P1, R1, R2 etc., inductances such as L′, capacitances C1, C2, etc., an output transformer LS, and a network of conductors by which these other components are connected together. It is the production of the connecting network that will first be studied.

Figure 1:
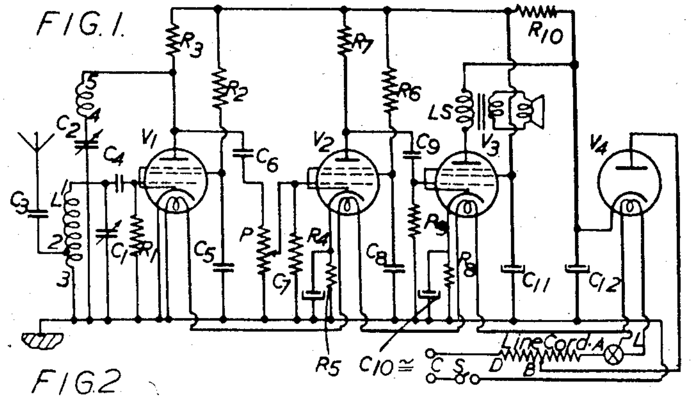
Figure 1 is a diagram of connections of a radio receiver.
Figure 2:
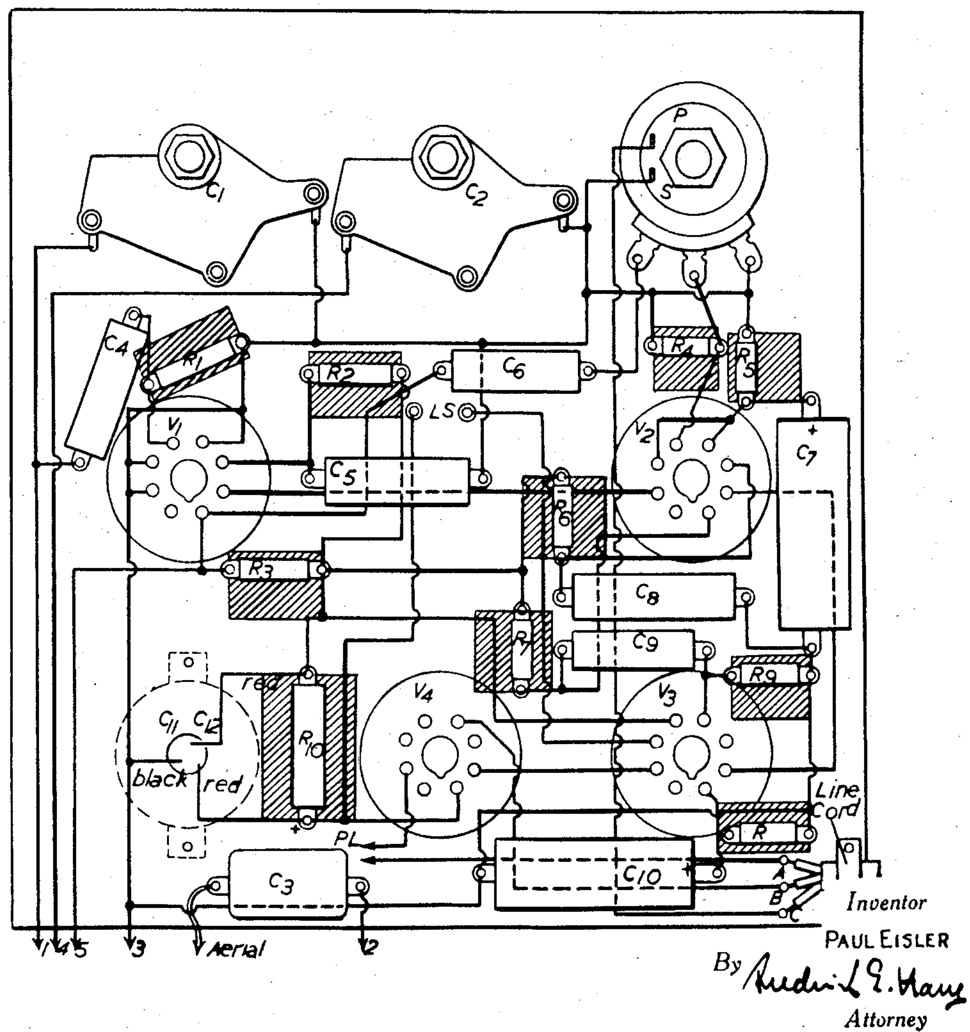
Figure 2 is a diagram showing the approximate lay-out of the components of this receiver.

The radio engineer charged with the manufacture of a radio receiver according to Figure 1, must first plan the lay-out of the several components, including the connecting network, and produce a lay-out and wiring plan such as is shown in Figure 2. The design of this lay-out is again a matter for the radio engineer with which the present invention is not primarily concerned; though the radio engineer familiar with the present invention will naturally in planning his lay-out have regard to the fact that such and such components of it are to be made by the methods of the present invention. The correspondence between Figures 1 and 2 is sufficiently apparent from the references upon the several parts already mentioned.

It will be noted that the circuit connections shown in Figure 2 involve several instances of crossing conductors; for instance the connection from LS to V3 crosses the connections from R3 to V3. In wiring with pre-formed wires such connections are kept separate by suitable disposition in three dimension; Figure 2 is not intended to represent such disposition; indeed some conductors are displaced to one side merely for the sake of clearness.

For the application of the invention to the manufacture of such a network it is manifestly convenient for the connections to be disposed in one plane; but if they cannot be so disposed without crossings it will be convient to dispose them in two or three or more planes; so making the network two or more circuit components which are printed separately or side by side and afterwards assembled in superposition or other desired relation and connected together where necessary.

Figure 3:
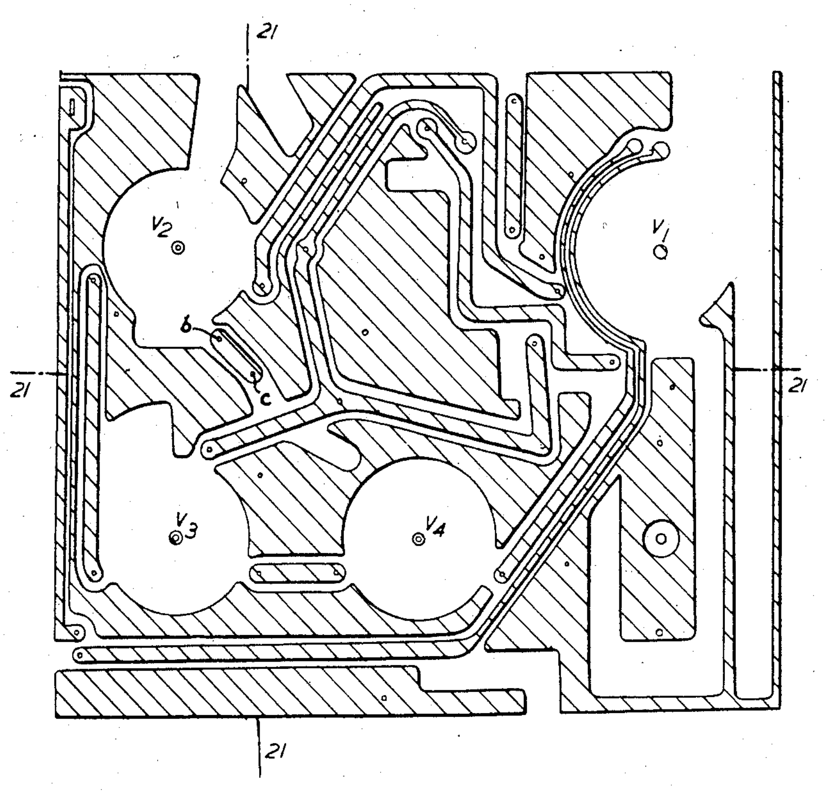
Figures 3 and 4 show two part schemes of connections prepared for the purpose of applying the invention to the manufacture of the circuit connections of this receiver.
Figure 4:
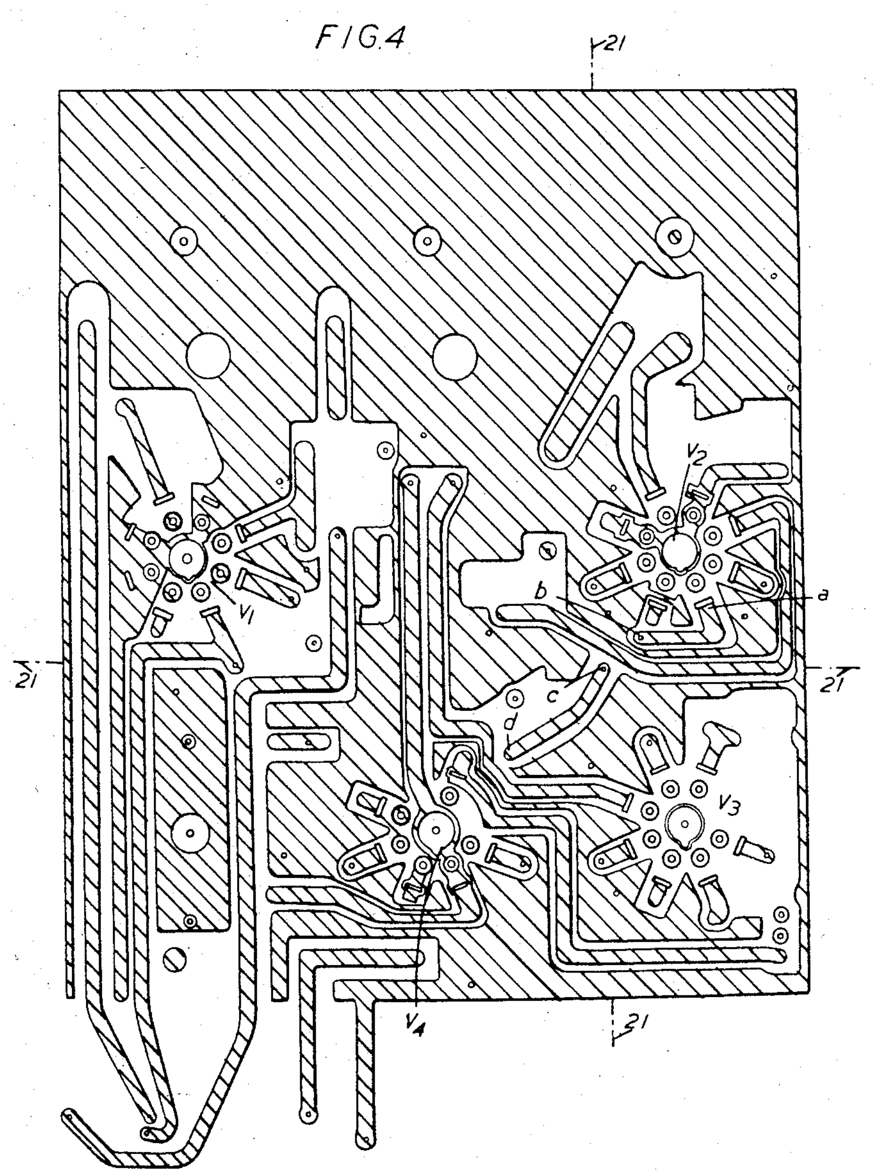

In the present instance the whole of the circuit connections can conveniently be set out in two planes, and they are shown so set out in Figures 3 and 4. The general resemblance of Figures 3 and 4 to the lay-out plan of Figure 2 can be seen at a glance, and the location of various components other than the network itself can readily be recognized. For example, V1, V2, V3 and V4 in Figures 3 and 4 mark the location in the network of the tubes or valves indicated by those references in Figures 1 and 2. It will be seen that if Figure 4 be directly superposed on Figure 2 the valves, or rather valve holders, indicated in the latter figure come in the places to which valve connections converge in Figure 4. Figure 3 will similarly register with Figure 2 and with Figure 4 if turned face downward. If the correspondence of these figures be studied in detail it will be seen that some conductors shown in Figure 2 appear in part in Figure 3 and in part in Figure 4; for example the connection between V2, C9 and R7 in Figure 2 is represented by the connection *a*, *b* from the position of V2 in Figure 4, the connection *b*, *c* in Figure 3, and the connection *c*, *d* in Figure 4. Provision has to be made for joining these connections into one conductor in the finished articles; for this reason the parts of it are drawn so that their ends overlap when Figures 3 and 4 are superposed back to back; thus the points *b* and *c* of Figure 4 overlap and register with the points *b* and *c* of Figure 3.

To make possible the employment of universal tools, as hereinafter described, in the manufacture of various schemes of connections, of which Figures 1 and 2 are only one example, it is convenient to limit the possible positions of junction points such as *b* and *c*. For this reason it is of advantage to prepare the drawings of the part schemes, Figures 3 and 4, by the aid of squared tracing paper and to arrange that every junction point falls upon an intersection of the lines of the grid. It would only confuse Figures 3 and 4 to superpose such a grid upon them; two lines of the grid are indicated by the chain lines 21 passing through the point *c*, in both Figures 3 and 4.

From the drawings, Figures 3 and 4, printing plates are prepared by any of the usual methods of the printing art. These printing plates may, for example, be engravings on metal, or lithographic stones, or they may be photographic plates. The printing plates so produced may be in relief, in intaglio, or planographic, according to the method of production.

From the two printing plates so produced any desired number of identical prints of the circuit component may be made.

In one form of the invention, convenient for the instance under consideration, the prints are made upon a composite material consisting of metal foil upon an insulating backing. The thickness and nature of the foil and of the backing depend upon the particular process chosen for converting the imprint of the circuit component into a circuit component. Metallized or metal-severed paper is one material; it is preferable to impregnate the paper with an acid-resisting varnish made of a suitable plastic. Or metal foil may be coated with varnish or with a layer of plastic of the desired thickness. Or a metal coating may be applied to a preformed sheet of insulating material, such as a plastic. Zinc, aluminium, and copper may be named among suitable metals.

For the purpose of the particular example of the invention now under consideration, the print is made with an acid-resistant ink upon the metal side of such composite material. Except where the pattern to be printed is very fine it is an advantage to impart a grain to the metal surface by use of an etching bath, or by abrasion or otherwise, prior to printing. The print may be made directly from the printing plate or by the off-set method. To ensure a print free from pinholes, the print may be overprinted or otherwise reinforced. The print is naturally identical with Figures 3 and 4, and those figures equally represent the drawing from which the printing plate was prepared, and the print made from the plate upon the metal surface of a composite sheet.

The part circuit components are next perforated at all the points at which junction has to be made between the conductors of the sheet corresponding with Figure 3 and those on the sheet corresponding with Figure 4, that is to say, at all points such as *c*. The restricted location of such junction points as above described enables all the perforations, whether for these particular components or for any other circuit components of like area, to be made by a universal punching tool in which pin punches can be inserted at any of a large number of positions corresponding with the intersections of the grid employed in preparing Figures 3 and 4. If these are large areas of metal to be removed they may be punched out prior to etching, for instance simultaneously with the perforation, so as to even up the extent of etching necessary all over the print.

The sheet is then etched in the well-known manner of the printing art, in a bath suited to the particular metal employed, but with this difference from the usual etching of a printing process that the metal not protected by the resistant ink is wholly etched away. To permit of this complete etching away without undue undercutting of the protected parts it may be convenient, as is commonly done in preparing printing plates, to interrup the etching and re-coat the surface, for instance with a fatty ground, which can be made to protect the sides of the etched lines as well as the outer surface. When etching is complete the ink may be washed off.

It will be clear that Figures 3 and 4 equally represent the etched print, that is to say, they may be regarded as depicting a sheet of insulating material coated with metal over the shaded parts only.

Figure 5:
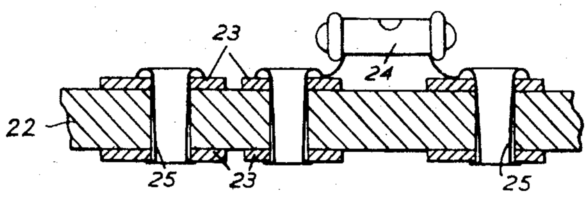
Figure 5 is a cross-section illustrating the making of connections between one part scheme of connections and another and between the circuit leads and a component by means of an eyelet.
Figure 6:
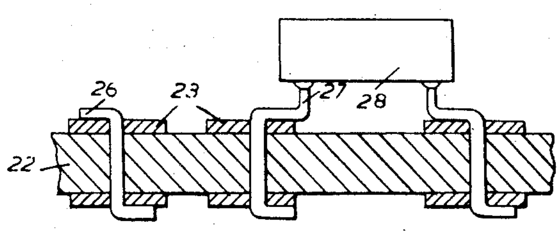
Figure 6 is a cross-section illustrating the making of connections between one part scheme of connections and another and between the circuit leads and a component by means of stitching wire.

The two part circuit components are now superposed back to back and metallic junctions are made between them at all the perforations. Such connections may be made in the manner now common in the radio art by means of eyelets. Figure 5, for example, shows a cross-section of a small portion of an insulating sheet 22, having conductors 23 on each side of it produced by printing methods such as that above described or those described hereinafter, and the conductors on one side are joined to conductors on the other side, and to the terminal tags of other circuit components such as the resistance 24, by eyelets or hollow rivets 25. Or such connections may be made by wire stitching, using wire staples, or wires bent twice at right angles into S form as seen at 26 in Figure 6, and the terminal wires 27 of a component such as the fixed capacitance 28 of Figure 6 may be used for such stitching. The eyelets or wires are preferably tinned and solder-pointed, so that the joints may subsequently be perfected by soldering. This operation also may be performed by a heated universal tool in which soldering bits are set at the position of the junctions of the circuit component in course of manufacture. If desired, the metal may be protected and insulated by a coating of varnish except over points required to be accessible for purposes of testing or the making of further connections.

The circuit may be tested by a universal testing appliance which permits of contacts being set in desired positions on a surface.

If desired a single printing plate may reproduce the two representations, Figures 3 and 4, side by side, on the same composite sheet. In that case the conductors developed from the print are superposed by folding the sheet back upon itself with the conductors outward.

It will be seen that the essence of the particular method of producing circuit components just described is the preparation of a printing plate, the printing from it of a representation of the conductors of the circuit component, thereby differentiating on the printed surface the areas which are required to be conductive from those which are required to be non-conductive, and the subjecting of the surface to an after treatment which operates differently on the differentiated parts and converts the differentiation into a differentiation of conductive and non-conductive areas. The imprint made is a positive imprint, that is to say, the inked part represents the conductors of the component; and the imprint is made on metal; and the component is completed by removal of metal from the unprinted areas. It will be seen below that it is not essential that the imprint be positive, nor that the imprint be made on metal, nor that the component be developed by removal of metal.

In the particular method just described removal of metal was effected by chemical etching; it could equally well be removed by electrolysis, the print being made on metal foil upon a conductive backing, say of another metal, and the printed surface being made the anode in a bath of electrolyte which attacks the foil. This method is appropriate when it is to be followed by transfer of the conductor to a permanent insulating base, after which the conductive backing is dissolved or otherwise removed. In the case of some metal foils, for example aluminum, it may be convenient, instead of removing them wholly, to convert them into non-conductors by a process well-known as "anodizing," and which also consists essentially in making the metal an anode in a suitable electrolytic bath.

Instead of producing the circuit component from the imprint by removal of metal it may be produced by adding metal. For example, the printing plate may be prepared to print a negative of the circuit component, that is to say, to cover with ink those parts of the surface which are to be non-conductive. A negative imprint can be made in insulating ink upon metal foil, say zinc foil, on a suitable backing, and additional metal of a different kind, say copper, can be added to the parts not inked by electrodeposition, the printed foil being made the cathode in an electrolytic bath. Or the printed foil may be subjected to a galvanizing process by coating it with flux and passing it through a bath of molten metal, which must naturally be a metal of low melting point such as Rose metal or a sodering alloy, melting at a temperature which will not harm the insulating backing. These methods, also approximately precede transfer, for the metal foil must subsequently be removed, at least over those areas covered by the ink and therefore not covered by added metal, and this may readily be done after transfer in an acid bath which attacks the metal of the foil but not the added metal.

Other modifications of the method of producing a circuit component by adding metal to the printed surface do not require the print to be made on metal. A positive imprint of the circuit component may be made in sticky ink upon an insulating ground, and the imprint may be metallized in various ways of which the following are examples. Metal leaf may be applied to the printed ground, and so much of it as does not adhere may be removed by dabbing. Or metal powder may be dusted on in the manner usual in the "bronzing" process of the printing art; it will adhere to the imprint and elsewhere may be removed; the adherent powder is not, however, conductively continuous and must be made so by subsequent consolidation. One method of consolidating a discontinuous powder imprint is to spray metal on the printed and bronzed ground by tools familiar in the art of painting for protection; in the typical case the metal is melted and broken into a fine spray by air under pressure which propels it through a spraying nozzle. The metal spray is molten or at least soft when it impinges on the metal dust of the print, and joins its particles metallically. Alternatively the metal dusted on may include a component of low melting point, such as Rose metal, or a solder, and a flux, as well as a component of less readily fusible metal. These may be mixed as powders or be applied in succession, provided they are intimately mixed in the print. By subsequent heating the low melting point metal is caused to unite the less readily fusible particles. It is not satisfactory to use a low melting point metal alone as it tends to fuse into discrete globules.

Another method of consolidation is to subject the bronzed print to a hot galvanizing bath. A third method is to heat the bronzed imprint in the vapor of a metal compound which readily dissolves; for example, iron may be thus deposited on the imprint by heating it in the vapor of iron penta-carbonyl; the heating may be effected by a high frequency magnetic field.

If the process of consolidation to be employed involves heating to a temperature at which the ink imprint might soften, something must be done to fix the bronzed imprint in position before consolidation. One means of fixing is to include in the composition of the ink a thermo-setting plastic, which is polymerized and set by heating before the process of consolidation; heating may be effected by a high frequency electro-static field, or by infra-red radiation.

The invention also includes the converse of each of these methods, which consists in preparing a printing plate to print a negative of the circuit component, and making the imprint in ink to which metal will not adhere upon an insulating surface to which it will adhere, and thereafter apply leaf metal or dusting on metal powder and consolidating as above described.

The necessary intimate association of the two metals to be dusted on is better ensured by coating the metal powder of high melting point with a metal of lower melting point, which may be effected in an electrolytic bath, or, particularly in the case of alloys such as Rose metal, by stirring the powder of high melting point metal into suspension in the molten low melting point alloy, and grinding to powder the solidified product. The flux may also be a coating on one of the mixed powders or on the metal-coated metal particles made as just described. If the particles are not also coated with flux there may be included in the ink of which the imprint is made ingredients such as rosin oils to serve as flux.

If desired, the less readily fusible constituent metal required to produce a consolidated imprint, or both metals, may form the pigment of the printing ink. In the former case the metal particles in the ink may be coated with flux and the second metal ingredient may be added in any of the ways above described, by hot soldering, by spraying, or by deposition from vapor. In the latter case the pigment may consist of particles of less readily fusible metal coated with fusible metal and, if desired, with flux also, and consolidation will be effected by simple heating of the print, say by a high frequency magnetic field.

The printing plate may be a photographic plate or film, in which case the imprint is made by contact printing or projection upon a sensitized surface. For example, a metal plate may be gelatine coated as in zincography, and printed from a negative of the circuit component. The coating is hardened where it is exposed to light and elsewhere may be washed away, and the metal so uncovered can be etched away, preferably in stages. Or the hardened gelatine may be inked, and dusted with metal which is consolidated as above described. The imprint may be transferred to a permanent base prior to consolidation, and this is necessary if the gelatine could not withstand the consolidation process chosen.

Any of the processes above described may include or be followed by the step of transferring the imprint from a temporary to a permanent base, provided due regard be paid to the requirements of that step in the selection of materials.

These various methods by which an imprint of a circuit component is converted into a circuit component are to be regarded as illustrative examples only; to those acquainted with the printing art, from which most of the individual steps employed are taken, with some modification, it will be obvious that many other modified operations or modified sequences of operations may be adopted according to the nature of the circuit component that is to be made. A few of these are mentioned below in connection with the making of particular circuit components.

Reverting to the radio receiver of Figures 1 and 2, there has so far been described the production of only one of its circuit components, namely the circuit connections, which can be produced by any of the methods above described. To what extent it is convenient to employ the invention in the making of other components of the radio receiver is a question to be answered on economic grounds. The illustrative examples next described show that other components may readily be made by similar methods, and those examples will assist in indicating how the design of components may usefully be modified with a view to their being manufactured by a printing process.

Figure 7:
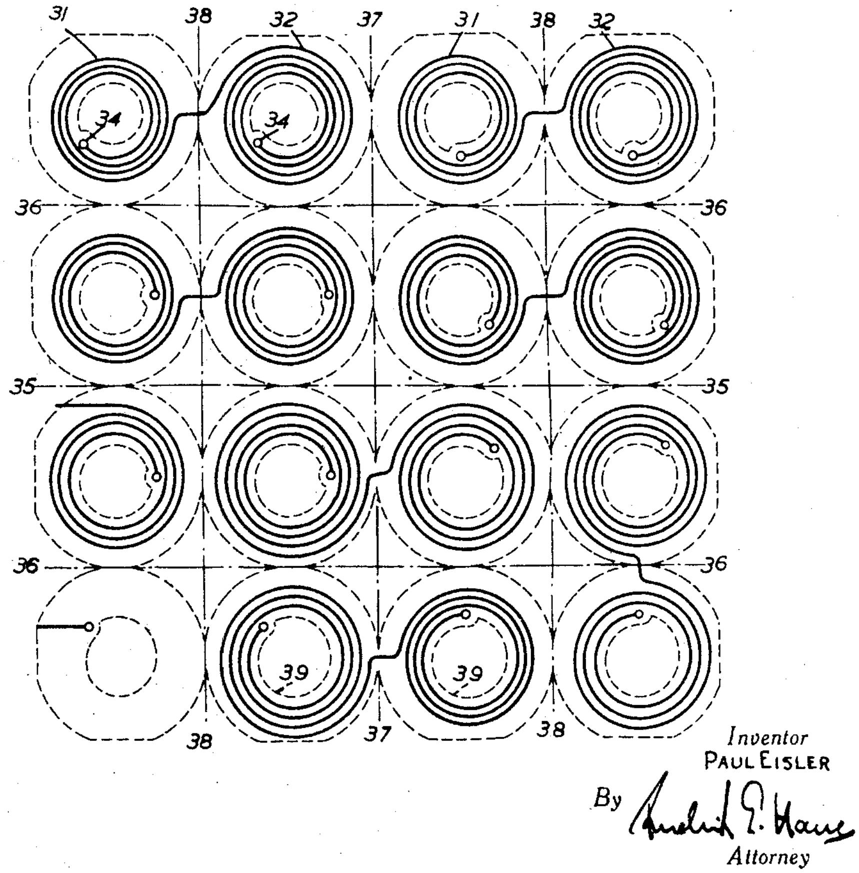
Figure 7 is a pattern of flat spirals illustrating the making of inductance coils according to the invention by printing with the additional step of folding.

The inductance L′ of the antenna circuit may take the well-known if less usual form of a flat spiral, such as one of the spirals 51 of Figure 7. On account of exigencies of drawing the spiral is shown as consisting of a few well spaced turns; the printing methods above described, particularly, for example, the method of printing and etching first above described, permits of the making of a spiral of hundreds of turns spaced apart no more than a few thousandths of an inch. Hence a single spiral will commonly suffice for the inductance L′. The spiral is drawn out carefully, a printing plate is made from the drawing, an imprint is made on metal foil, on an insulating backing, and the metal not protected is etched away; or another of the procedures above described is followed.

Figure 8:
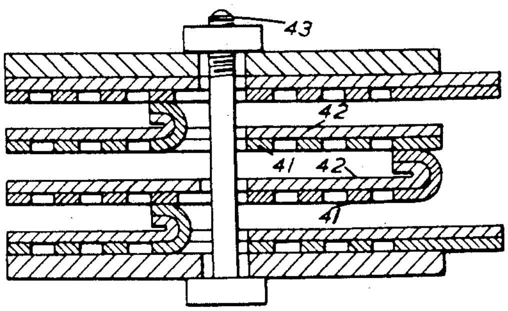
Figure 8 illustrates another way of joining parts of a component.

If greater inductance is required than can conveniently be obtained in a single spiral—for example, if a winding of a great number of turns is required with or without an iron core—the spiral pattern may be repeated as often as desired. A convenient pattern is that shown in Figure 7, which consists of pairs of spirals 31, 32, joined at their outer ends. The free ends of the spirals form junction points 34, and it will be noted that some of these, but not all, have the same angular position as each other; for example no two of the spirals in the second row have their free ends in the same position, but each of them has its free end in the same position as has the spiral beneath it in the third row. This pattern may be printed on metal or on impregnated paper backing which can readily be folded. After the print has been metallized in one of the ways above described and its surface coated (or left coated) with insulation, except at the junction points, the sheet is folded about the line 35—35. The junction points become superposed in register and may be connected by spot-welding by a universal welding tool analogous to the soldering tool above mentioned. Or they may be joined as explained with reference to Figures 5 and 6. After the junctions have been made the print is further folded about the lines 36—36, the line 37—37 and lines 38—38. By a small modification in the pattern, junction points may be made to abut upon one another on folding, as shown in Figure 8, which is a cross section of several spirals 41 on insulating sheets 42, the inner or outer end of each spiral being folded to abut on the inner or outer end of its neighbor; the spirals are held together by the bolt 43 which exerts sufficient pressure to make a metallic connection at the points of abutment. If an iron core is to be used the centers of the spirals of Figure 7 are punched out along the dotted lines 39 before folding, and the insulation between spirals may also be punched out as indicated by the dotted circles surrounding the spirals.

Figure 9:
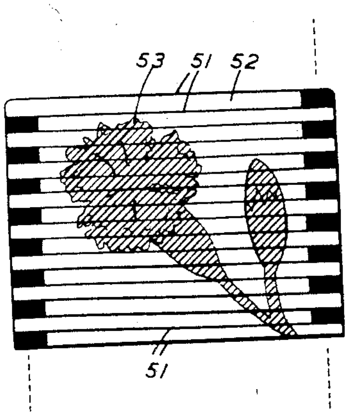
Figure 9 illustrates a printed pattern of parallel conductors having many useful applications.
Figure 11:
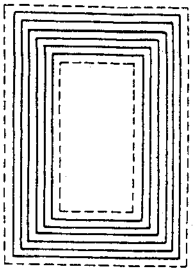
Figure 11 illustrates the making of a transformer core according to the invention.
Figure 12:
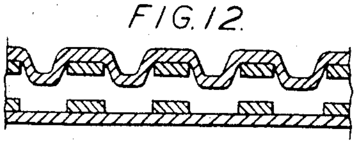
Figure 12 is a section of a helical inductance and its label showing how the label is positioned by embossing.

Figure 9 may be referred to here as illustrating a pattern of parallel linear conductors 51 upon an insulating ground 52, a pattern which may readily be produced by the method of the invention and which is the foundation of several varieties of circuit components. It will be seen that at each end of the pattern all the lines are joined so that electrically they are in parallel. In addition alternate pairs of lines 51 are joined further from the edge of the pattern so that if the extreme edges are sheared off the lines will be electrically in series. Again it is to be noted that exigencies of drawing make Figure 9 highly diagrammatic; in fact the pattern can be of enormously greater length, and be composed of a very great number of closely spaced lines. Figure 9 will be further described below. It is mentioned here as completing the illustration of the circuit component shown in Figure 10. In this figure 55 and 56 show the two ends of a long strip of flexible insulation bearing a pattern of parallel metallic lines, such as is illustrated in Figure 9, but in this case without any end connections between the lines. This pattern is here used as the basis for making a helical winding to serve as an inductance, or as the winding of a transformer or for like purposes. After printing and development of the metallic lines the strip is wound upon a former or upon a core such as that shown in Figure 11. It would ordinarily be a very tedious operation to wind a wire winding upon a closed core such as Figure 11 depicts, perhaps involving threading the bobbin through the core some thousands of times. But when it is remembered that the strip of Figures 9 and 10 may have hundreds of conductors side by side, it will be understood that thousands of turns of wire may be wound about a core by threading such a strip through it only a few times. However, the winding of the strip on the core in this manner only leaves the core winding with, say, a thousand separate conductors each encircling the core a few times. It remains to join these conductors in series, which involves, say, joining the end of the lowermost conductor in the end 55 of the strip to the uppermost in the end 56 and so on. This is conveniently done by the aid of a label 57 of transparent insulating material bearing a pattern of parallel conductors of similar spacing to the conductors of the strip 55, 56 insulated at their middle parts but bare and solder-painted at their ends. In order that this label may be accurately applied to the ends 55, 56, as is necessary considering the close spacing of the conductors, the label is not only printed but embossed, preferably in the printing operation, so that the ends of its conductors lie in grooves. Figure 12 shows a section of the label 57 and of the end 56 upon the lines XII—XII of Figure 10, and shows the end of the label superposed upon the end of the strip. It will be seen that the embossed parts of the label will fit between the conductors of the strip and thereby cause the conductors of strip and label to be accurately superposed. A soldered joint is made by heat and pressure. The flaps 58 of the label may be coated with adhesive and folded around and made adherent to the back of the ends 55, 56.

Figure 10:
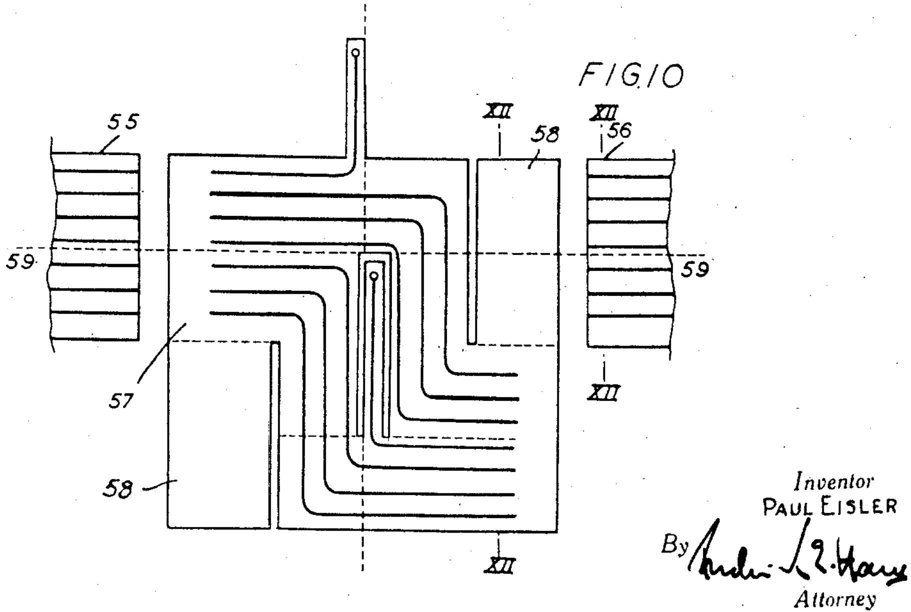
Figure 10 is a pattern of lines on a principal sheet and a connector label illustrating the making of a helical inductance coil according to the invention by printing with the additional steps of winding the principal sheet and attaching a connector label.
Figure 13:
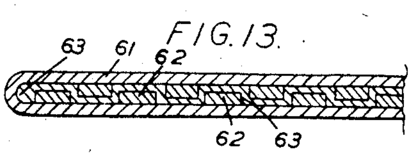
Figure 13 illustrates a modification of the pattern of parallel lines.

If it is desired to have parallel conductors upon a strip such as that of Figure 9, or the strip 55, 56 of Figure 10, more closely spaced than lines can reliably be printed, the spacing of the lines may be increased to a little more than the width of the lines, and after printing and metallizing the lines may be varnished with plastic. The strip can then be folded about a mid line (59, 59, Figure 10), running lengthwise of it, so that the conductors of one half of the strip come to lie between those of the other half; this is seen in Figure 13 which is a cross-section of such a folded strip, 61 being the insulating backing, 62 the conductors, and 63 their insulating coating.

Where the invention is applied to the making of the magneto-conductive part of an electrical circuit component, such as a transformer core, the metal employed for metallization is naturally iron. The invention is especially of value in the making of cores for radio frequency transformers for in these it is worth while for the avoidance of eddy current losses to divide the iron of the core, not merely into laminations, but into separate and fine wires. The printing of a pattern of parallel iron conductors as shown in Figure 11 upon a ground of the thinnest insulation that will afford the requisite strength and has the desired electrical properties, and the stamping out of the pattern from the sheet and of the center from the pattern as indicated by the dotted lines, need no further explanation; nor does the building up of the core by assembling a great number of such patterns in a pile. Obviously any usual form of laminated core may be built of printed line patterns in this way.

Figure 14:
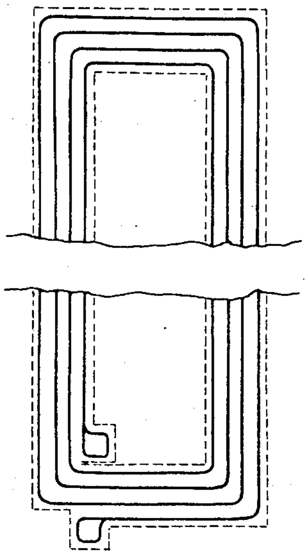
Figures 14 and 15 illustrate the making of an inductance from a pattern of rectangles with the additional steps of twisting and winding on a double core.
Figure 15:
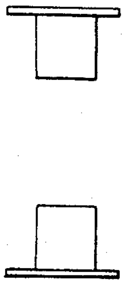

Figures 7, 10 and 12 illustrate different ways in which the electro-conductive or magneto-conductive part of a circuit component originally printed on a flat sheet, or maybe on a cylinder may be deformed into a three dimensional structure; Figures 14 and 15, showing an alternative way of building a cylindrical coil, for instance a relay winding, illustrate a third kind of deformation. In this case the printed pattern consists of a great number of elongated approximately rectangular turns one within the other; the middle part of the figure is broken away to indicate that its length may be large compared with its width. When this is metallized the conductor is continuous from end to end. It is formed into an inductive winding by stamping out its middle as indicated by the dotted line and winding it on the two-part core or former shown in Figure 15, preferably so that its ends become superposed, and then turning one part of the core or former end for end, thereby twisting the ends of the rectangular pattern, and bringing its long sides into juxtaposition with the current travelling around the core in the same direction in all of them.

Figure 16:
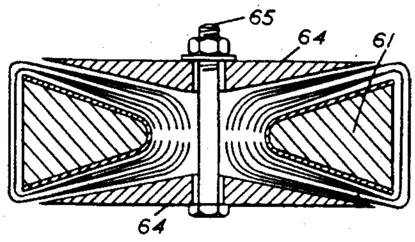
Figure 16 is a cross-section of a transformer built by the method of the invention and Figure 17 illustrates the printing of its core.
Figure 17:
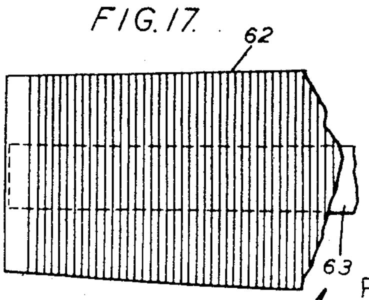

As already mentioned, where it is intended to use the method of the invention for the production of a circuit component regard may be had to that fact in the electrical design of the component. Figure 16 is a cross-section of a transformer designed to be built by the method of this invention. Its windings 61 may be built of superposed spirals, such as are illustrated in Figure 7, all of the same external diameter but decreasing in radial depth from the middle outwards. Primary and secondary windings may be printed together, closely intermingled to eliminate magnetic leakage. Together the superposed imprints form an annulus of roughly triangular cross-section. Alternatively the winding may be wound of wire upon a former of V-section. The core is built from the printed strip 62 shown in Figure 17; it is a slightly tapering strip (the taper is exaggerated in the figure) on which are formed a large number of parallel closely spaced iron lines. This strip is of very thin insulating material. The middle of the strip is reinforced by a narrower tapered strip 63. The composite strip is wound around the winding 61 and as it is wound it is folded about the edges of the reinforcing strip, so that the ends of the iron lines come together in the middle of the core as seen in Figure 16. Its insulation breaks and crumples permitting the iron lines to overlap radially. The ends of the lines are brought into good magnetic contact and so held by the end cheeks 64 and the bolt 65.

The invention is by no means confined to the building of circuit components for radio receivers. The pattern of parallel lines described with reference to Figure 9 is a typical pattern for the production of electrical resistances, for example, for all kinds of heaters. The pattern of parallel resistant conductors may be wanted upon some article or fabric to be heated on which it is not convenient to print. In that case the resistant pattern is produced by printing upon a temporary ground, for instance, printing upon foil of resistant metal upon a backing of waxy paper, and is transferred to its permanent backing by a subsequent operation. The method of printing and etching and subsequent transfer, for example, might well be used to produce a resistant conductor upon cement or plaster of Paris.

A resistant conductor such as indicated in Figure 9 may be formed upon wall-papers, wall and furniture panels, curtains, and other hangings, upholstery fabrics, floor coverings, clothing and bed-clothing, and the like for the purpose of making electric heaters or rather warmers of them. Such a conductor, though of small thickness, will carry a substantial current because its flat form promotes loss of heat by radiation and conduction. The conductor will be insulated and protected by a covering, for instance of a varnish or plastic on which powdered metal oxide may be dusted to increase radiation; in the case of aluminum the conductor is referably covered by oxidation for the same reasons.

When used on ordinarily ornamental fabrics such as wallpapers the pattern of Figure 9 may be made to provide or contribute to the ornamentation by a double printing process. There is first produced a pattern of parallel lines of say, aluminum, copper, zinc, iron or nickel. Upon this any ornamental design 53 is printed in an insulating ink. The sheet is then made the cathode in an electrolytic bath by which copper is deposited on the metal lines except where covered by ink. The final product is, as before, a sheet with a pattern of parallel lines of which those parts within the design are of higher resistance than the remainder. Alternatively the overprinted sheet may be anodized to bring about reduction in the cross-section of the unprotected parts.

However, the second pattern may be superposed merely for its appearance without any thought of making the pattern rather than the non-patterned part the source of heat, or vice versa. In this case it may be desired to render the pattern of parallel lines inconspicuous to the eye, by suitable dyeing of the base, or of the oxide-coated or otherwise insulated conductor. For such overprinting a pattern of parallel lines of aluminum may be used with advantage, and the sheet subjected to an anodizing process and dyeing process by which effects of some beauty may be produced. By the use of dyes which change color at a temperature above atmospheric and below that which the conductor, or a part of it, reaches when carrying current, a visual indication may be given when the heat is on.

Figure 18:
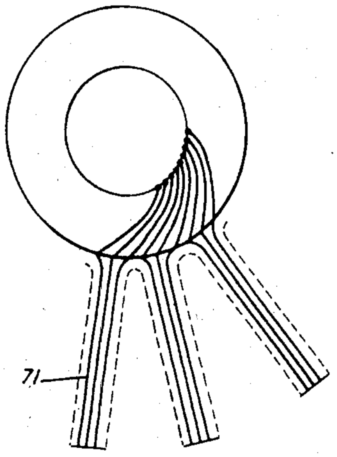
Figures 18, 19 and 20 illustrate the application of the invention to the printing of the conductors of dynamo electric machines.
Figure 19:
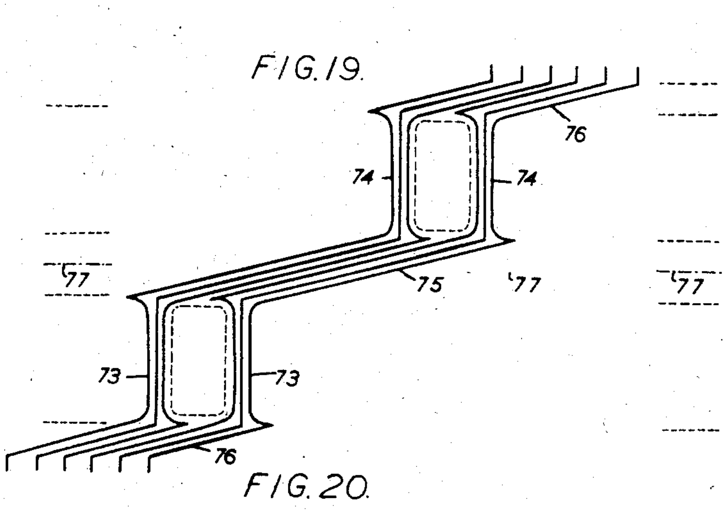

A class of printed patterns deserving mention is the patterns for winding the toothed cores of dynamo-electric machines. In one form shown in Figure 18 the pattern is mainly a star, in which each ray is a group of parallel conductors 71 representing the conductors of one slot; the inner and if desired the outer ends of the rays are prolonged at an angle to their length to form end connections preferably of the form of involutes of a circle; the insulating material, between the groups of slot conductors is removed as indicated by the doubled lines, so that the slot conductors may be folded through a right angle to enter the slots. Or the slot conductors may appear in the pattern as parallel groups of parallel lines 73 (as seen in Figure 19) upon an insulating sheet which is to be wrapped around the slotted core, openings being punched between the slot conductors, as indicated by the dotted rectangles, for the passage of the teeth. The end connections may be brought into their proper relative position by folding of the insulating sheet. For example, the pattern may consist of two rows of groups of parallel lines 73, 74, those of one row being joined to those of the other by other parallel lines 75 at an inclination to the groups, while the outer ends 76 of the group are prolonged at the same inclination. By folding this pattern about a line 77 at right angles to and mid-way between the groups, the latter are superposed in the same slots or made to lie side by side in neighboring slots, while the inclined lines 75 and 76 become end connections of V form. The rectangular openings punched in the insulating sheet between the groups, as indicated by dotted lines, encircle the teeth when the winding is placed on the core.

Figure 20:
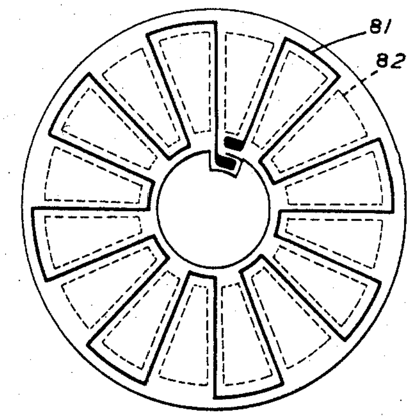

The invention is even more readily applicable to dynamoelectric machines employing an armature of disc form or consisting of a plurality of discs, as in some types of multi-pole alternator and inductor alternator. One such disc is shown in Figure 20. The conductor 81 has its radial turns spaced a pole pitch apart, or in the case of the inductor a tooth pitch apart. The ground upon which the print is made and the metal built up may be stamped out as indicated by the dotted line 82.

Figure 21:
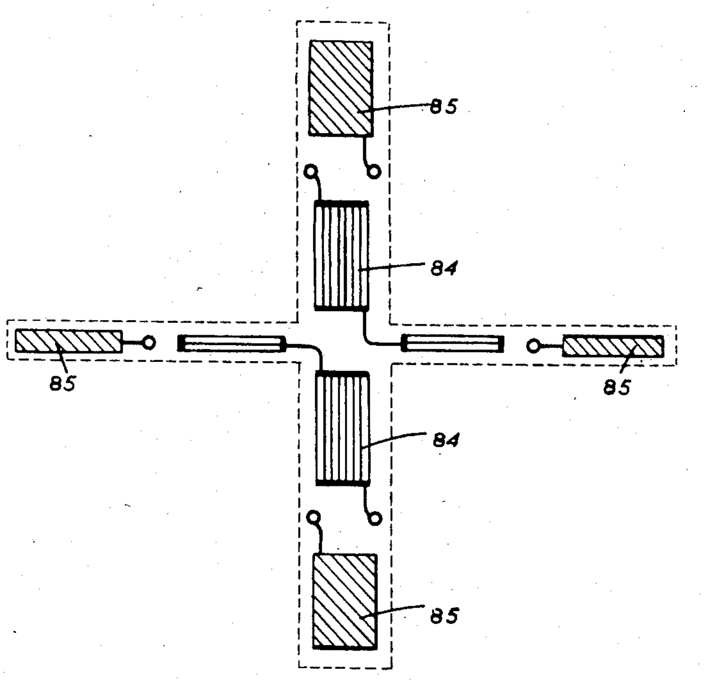
Figures 21 and 22 illustrate the application of the invention to the printing of the conductors of a thermionic tube or valve.
Figure 22:
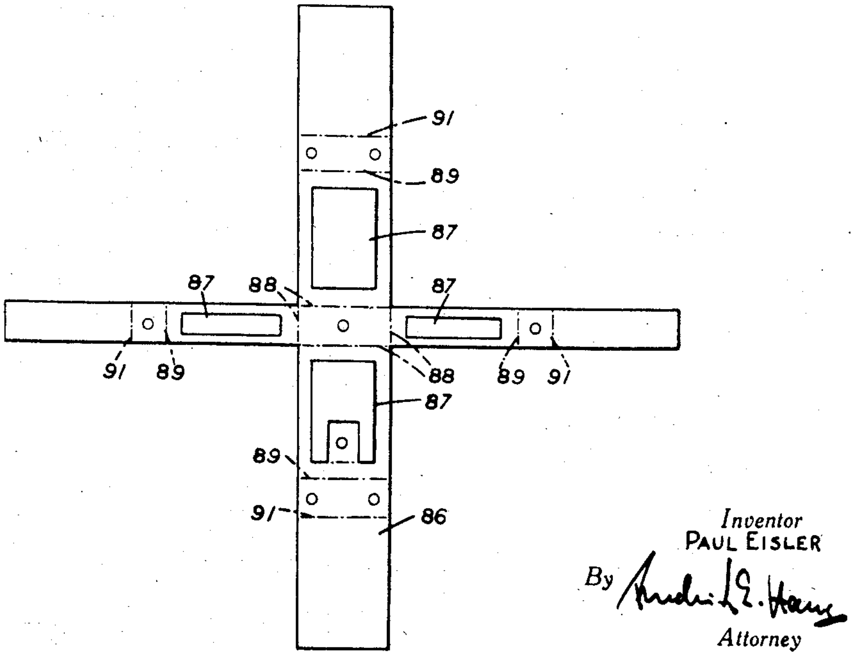

An example of an electrical circuit component in the production of which a process including the step of transfer is desirable, is the electrodes of a thermionic tube or valve. Figure 21 shows the pattern of the electrodes for a double triode, with the exception of the cathode. There are two grids 84 and two anodes 85. A negative of this pattern may be printed in insulating ink on metal foil, and another metal may be deposited electrolytically on the bare lines of the foil. The imprint is then transferred to a permanent support of glass, which initially is a plane cross 86 as shown in Figure 22 with apertures 87 in it in position corresponding to the position of the elements of the grids in Figure 21. The foil which formed the temporary base is then removed. The support 86 is heated and (the print being on the upper face) its four limbs are folded downward through a right angle about the lines 88; then they are folded outward about the lines 89, and upward about the lines 91. The assembly is mounted on a glass stem around the cathode and connections are made from the grids and anodes to wires sealed through the stem; and the whole is then sealed into a bulb which is evacuated in the usual manner.

This application is a division of my application Serial No. 11,796, filed February 27, 1948, and now abandoned, which is a division of my original application Serial No. 520,991, filed February 3, 1944, now Patent No. 2,441,-960, dated May 25, 1948, entitled "Manufacture of Electric Circuit Components."

I claim:

A method of producing the conductive metal portions of three-dimensional electric and magnetic circuit units in which the metal portions forming the circuit in a finished unit are situated in several planes and also extend between two planes whereby the metal portions cannot be developed into one plane without severance of the continuity of the circuit, said method comprising the steps of preparing a representation of the prospective three-dimensional circuit unit in the form of several separate but complementary representations of two-dimensional sectional patterns, each of said representations of sectional circuit patterns representing a corresponding two-dimensional part of the circuit unit to be produced, printing a repeat pattern of said representations upon a stock material in the form of a rollable composite sheet of an insulation backed metal layer, producing by a printed circuit technique said sectional circuit patterns from a metal layer, severing a group of insulation backed sectional patterns complementing each other to a circuit unit from said stock material, shaping said severed sectional patterns so as to bring the same into said several superimposed planes and to place in register predetermined zones of the patterns to be conductively joined, securing together and electrically interconnecting the superimposed sectional patterns thereby converting the two-dimensional sectional patterns into the desired three-dimensional circuit unit.

References Cited in the file of this patent

UNITED STATES PATENTS

| | | |
|---|---|---|
| 890,988 | Kitsee | June 16, 1908 |
| 905,045 | Ayer et al. | Nov. 24, 1908 |
| 1,278,993 | Parks | Sept. 17, 1918 |
| 1,563,731 | Ducas | Dec. 1, 1925 |
| 1,647,474 | Seymour | Nov. 1, 1927 |
| 1,837,678 | Ryder | Dec. 22, 1931 |
| 1,892,146 | Harshberger | Dec. 27, 1932 |
| 1,939,130 | Mills | Dec. 12, 1933 |
| 2,011,114 | Papin | Aug. 13, 1935 |
| 2,014,524 | Franz | Sept. 17, 1935 |
| 2,404,129 | Flatland | July 16, 1946 |
| 2,474,988 | Sargrove | July 5, 1949 |
| 2,703,854 | Eisler | Mar. 8, 1955 |